US009431596B2

(12) United States Patent
Zhang

(10) Patent No.: US 9,431,596 B2
(45) Date of Patent: Aug. 30, 2016

(54) ELECTRONIC DEVICE

(71) Applicants: BEIJING LENOVO SOFTWARE LTD., Beijing (CN); LENOVO (BEIJING) LIMITED, Beijing (CN)

(72) Inventor: Guowen Zhang, Beijing (CN)

(73) Assignees: BEIJING LENOVO SOFTWARE LTD., Beijing (CN); LENOVO (BEIJING) LIMITED, Beijing (CN)

( * ) Notice: Subject to any disclaimer, the term of this patent is extended or adjusted under 35 U.S.C. 154(b) by 78 days.

(21) Appl. No.: 14/578,868

(22) Filed: Dec. 22, 2014

(65) Prior Publication Data

US 2016/0021785 A1 Jan. 21, 2016

(30) Foreign Application Priority Data

Jul. 21, 2014 (CN) .......................... 2014 1 0347483

(51) Int. Cl.
*H05K 7/20* (2006.01)
*H01L 41/09* (2006.01)
*H01L 23/473* (2006.01)

(52) U.S. Cl.
CPC .................................... *H01L 41/09* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46; H01L 23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

2004/0250562 A1* 12/2004 Adiga ....................... F28D 5/00 62/259.2
2005/0174735 A1* 8/2005 Mankaruse ........ H05K 7/20336 361/695
2007/0017658 A1* 1/2007 Lehman ............ H05K 7/20254 165/80.4
2007/0153480 A1* 7/2007 Zhang ...................... C09K 5/04 361/700
2008/0196868 A1* 8/2008 Attlesey .................. G06F 1/181 165/104.33
2008/0225489 A1* 9/2008 Cai ..................... F28D 15/0266 361/704
2008/0307806 A1* 12/2008 Campbell ............ F24F 5/0017 62/121
2009/0129011 A1* 5/2009 Balzano ................ H01L 23/473 361/689
2010/0246124 A1* 9/2010 Strong ...................... G06F 1/16 361/695

(Continued)

*Primary Examiner* — Anthony Haughton
*Assistant Examiner* — Razmeen Gafur
(74) *Attorney, Agent, or Firm* — Scully, Scott, Murphy & Presser, P.C.

(57) ABSTRACT

Embodiments of the present disclosure refers to an electronic device, comprising a first bracket that is made of a first material having a thermal conductivity greater than a first threshold and has therein at least one passage including a chamber; wherein the first bracket and the chamber define a closed space in which a cooling medium having a thermal conductivity greater than a second threshold is able to circulate; and wherein the chamber is provided with a driving body at at least one side wall of the chamber and the driving body is deformable under a perdetermined condition to change a capacity of the chamber so as to drive the cooling medium to flow.

10 Claims, 2 Drawing Sheets

(56) References Cited

U.S. PATENT DOCUMENTS

2011/0096504 A1* 4/2011 Hild .................... H01L 51/5237 361/704
2011/0103019 A1* 5/2011 Campbell .......... H05K 7/20236 361/702
2011/0188204 A1* 8/2011 Horiuchi ............... H01L 23/473 361/702
2011/0209853 A1* 9/2011 Parish ................. F28D 15/0233 165/104.26
2011/0249402 A1* 10/2011 Hentschel ............. H01L 23/473 361/699
2011/0308059 A1* 12/2011 Seo .................... B23K 20/1265 29/428
2012/0026692 A1* 2/2012 Loong ................. H01L 21/4878 361/702
2012/0113586 A1* 5/2012 Rau ........................... G06F 1/20 361/479.47
2012/0175094 A1* 7/2012 Rice .......................... F28D 1/03 165/170
2012/0180993 A1* 7/2012 Yoshikawa ........... H01L 23/427 165/104.21
2012/0188719 A1* 7/2012 El-Essawy ................ G06F 1/18 361/701
2012/0320529 A1* 12/2012 Loong ................. H01L 23/3735 361/702
2013/0186601 A1* 7/2013 Monson ............. H05K 7/20672 165/104.26
2013/0228313 A1* 9/2013 Fried ................... F28D 15/0266 165/104.26
2013/0301220 A1* 11/2013 Hotta ................. H02K 11/0073 361/699
2013/0312937 A1* 11/2013 Tsukinari .............. H01L 23/427 165/104.21

* cited by examiner

ELECTRONIC DEVICE

CROSS-REFERENCE TO RELATED APPLICATION

This application claims the benefit of Chinese Patent Application No. 201410347483.2 filed on Jul. 21, 2014 in the State Intellectual Property Office of China, the whole disclosure of which is incorporated herein by reference.

BACKGROUND OF THE DISCLOSURE

1. Field of the Disclosure

Embodiments of the present disclosure relates to heat dissipation technique, and more particularly, to an electronic device.

2. Description of the Related Art

Conventionally, heat generated by components of the electronic device is dissipated mainly by a fan driven by a motor, as an active cooling manner. Nowadays, for portable electronic devices, higher performance and thinner thickness are required. The above-mentioned conventional heat dissipation manner occupies larger space, causes more noise and results in severe electromagnetic interference, so it is not suitable to be used in portable electronic devices.

SUMMARY

The embodiments have been made to overcome or alleviate at least one aspect of the above mentioned disadvantages existing in the conventional technical solutions.

Accordingly, it is an object of one embodiment of the disclosure to provide an electronic device, in which a through passage is formed in a bracket disposed on the electronic device, a cooling medium is filled in the passage, and a driving body is used to drive the cooling medium to circulate in the passage, such that a heat dissipation of the heated components is achieved by circulating the cooling medium within the passage. As a result, the temperature on the whole surface of the bracket is made uniform and overheat on local area is prevented.

According to an embodiment, there is provided an electronic device, comprising a first bracket that is made of a first material having a thermal conductivity greater than a first threshold and has therein at least one passage connected to a chamber;

wherein the first bracket and the chamber define a closed space in which a cooling medium having a thermal conductivity greater than a second threshold is able to circulate; and wherein the chamber is provided with a driving body at at least one side wall of the chamber and is deformable, under a perdetermined condition, to change a capacity of the chamber so as to drive the cooling medium to flow, wherein a flow velocity of the cooling medium is variable in accordance with frequency of the deformation.

Preferably, the driving body has a first end and a second end opposite to each other, the first end is fixedly connected to the at least one side wall of the chamber while the second end is a free end, and wherein, the first end is connected to a power source for the electronic device and when the power source is switched on, the second end oscillates.

Preferably, the chamber is further provided with a partition dividing the chamber into a first sub chamber and a second sub chamber, and a first port is provided on an end of the first sub chamber away from the partition while a second port is provided on an end of the second sub chamber away from the partition; a first end of the at least one passage is connected to the first port and a second end of the at least one passage is connected to the second port such that the at least one passage and the chamber form a loop circuit; and a first valve is provided at the first port and a second valve is provided at a third port provided on the partition.

Preferably, with the second end of the driving body oscillating upwardly, a pressure of the cooling medium within the first sub chamber goes down, and the first valve is opened under the pressure applied by the cooling medium at the first end of the at least one passage such that the cooling medium flows from the first port to the first sub chamber, and, the second valve is closed under the pressure applied by the cooling medium within the second sub chamber; and with the second end of the driving body oscillating downwardly, the pressure of the cooling medium within the first sub chamber goes up, and the second valve is opened under the pressure applied by the cooling medium within the first sub chamber such that the cooling medium flows from the third port of the first sub chamber to the second sub chamber and further to the second end of the at least one passage through the second sub chamber, and, the first valve is closed under the pressure applied by the cooling medium within the first sub chamber.

Preferably, the driving body comprises a piezoelectric panel including a substrate that is connected to a positive electrode of the power source for the electronic device and a piezoelectric ceramic that is connected to a negative electrode of the power source for the electronic device.

Preferably, the first valve comprises a first flexible waterproof membrane having an upper portion connected to an upper part of the first port and a lower portion as a free portion; and the second valve comprises a second flexible waterproof membrane having an upper portion connected to an upper part of the partition and a lower portion as a free portion; with the second end of the driving body oscillating upwardly, a slit is formed between the first port and the lower portion of the first flexible waterproof membrane while the lower portion of the second flexible waterproof membrane sticks to the partition such that the cooling medium flows in from the first port; and with the second end of the driving body oscillating downwardly, the lower portion of the first flexible waterproof membrane sticks to the first port while a slit is formed between the partition and the lower portion of the second flexible waterproof membrane such that the cooling medium flows out from the second port.

Preferably, the first chamber is disposed in a first region of the first bracket, which is located at an edge of the first bracket.

Preferably, a first outer wall of the passage has a thickness less than a first threshold and is located at a surface of the first bracket.

Preferably, the first material comprises metal, and, the cooling medium comprises pure water, ethyl alcohol, or oil.

Preferably, the first threshold is greater than the second threshold.

According to one embodiment, an antirolling bracket is generally used in the electronic device and gets in contact with components in this electronic device. In the electronic device according to one embodiment, a passage that is communicated with at least one chamber is fowled in the antirolling bracket, a cooling medium is filled in the passage, and a driving body is disposed on the chamber. A cooling medium is circulated in the passage under the driving of the driving body. Once the component in this electronic device is overheated, a heat dissipation of the overheated component is achieved by circulating the cooling medium within the passage and carrying away the heat. According to one embodiment, instead of using a dedicated heat dissipation system in the electronic device, the antirolling bracket used in the electronic device is used as a part of a heat dissipation system to realize the heat dissipation of these internal heating components. According to one embodiment, the antirolling bracket is preferably made of material having good thermal conductivity. Once there is an overheated part in the electronic device, the heat will be transferred promptly to the cooling medium of good thermal conductivity. As a result, the heat generated by these components in the electronic device is taken away fastly, so as to achieve a uniform temperature in the electronic device and cool the electronic device quickly. Accordingly, the electronic device according to one embodiment greatly improves heat dissipation performance without increasing manufacturing cost.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF PREFERRED EMBODIMENTS OF THE DISCLOSURE

Exemplary embodiments will be described hereinafter in detail with reference to the attached drawings, in order to provide a thorough understanding of the objects, solutions and advantages.

Embodiments disclose an electronic device including but not limited to mobile phone, notebook computer, game console, tablet computer, E-reader, PDA, etc. In some embodiments, the electronic device preferably comprises mobile phone, notebook computer, and tablet computer.

Figure 1:
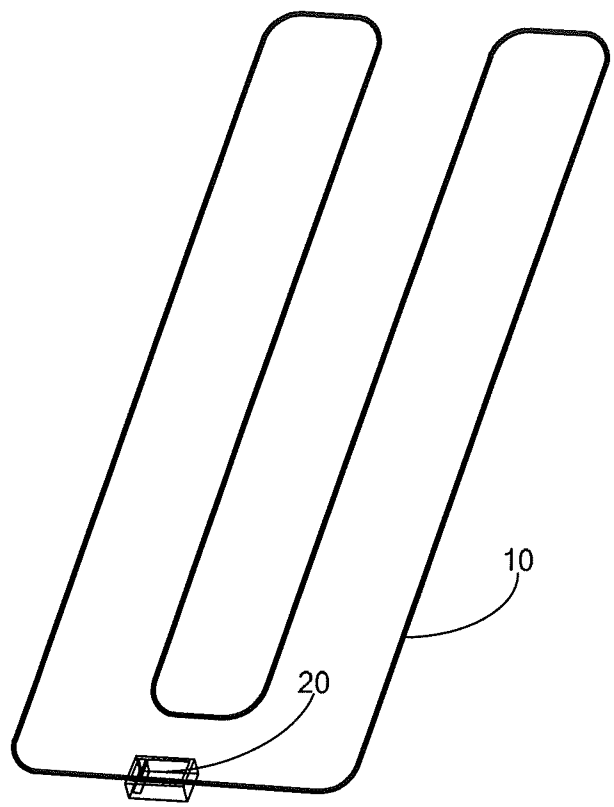
FIG. 1 is a schematic structural view showing a configuration of a first bracket in an electronic device according to an embodiment.

FIG. 1 is a schematic structural view showing a configuration of a first bracket in an electronic device according to an embodiment. Referring to FIG. 1, the electronic device comprises a first bracket 10 that is made of a first material having a thermal conductivity greater than a first threshold, and the first bracket 10 has at least one passage therein.

According to an embodiment, the first bracket may be embodied as an antirolling bracket in the electronic device. An antirolling bracket is generally mounted in an electronic device, which prevents the electronic device from falling down accidentally and damages the hardware such as memory, processer and the like. Antirolling brackets are generally mounted to the main body and the display screen of the electronic device. Mounting the antirolling bracket on an electronic device is originated from a antirolling bracket mounted on a racing car for reducing the impact on internal components. Similarly, the antirolling bracket mounted in an electronic device is also used to not only effectively stand against external force so as to secure internal key components, but also effectively protect the liquid crystal display screen in order to reduce the damage on the electronic device such as notebook computer due to accidental falling and shocks and ensure data safety. According to an embodiment, an antirolling bracket in the electronic device is used to perform a heat dissipation of internal components in the electronic device. According to an embodiment, a cooling medium passage is provided in the antirolling bracket of the electronic device and a cooling medium is filled in the passage, such that the heat dissipation of the electronic device is achieved by the antirolling bracket itself, which absorbs heat generated by these components and then the heat is carried away by the flowing cooling medium in the passage.

It should be noted that, generally, the antirolling bracket is disposed around components in the electronic device and is attached to these components. Accordingly, once heat is generated by a component, the heat generated by the component is transferred to the antirolling bracket quickly and the cooling medium absorbs the heat from the antirolling bracket and the flowing cooling medium carries away the heat, and as a result, the component in the electronic device is cooled.

According to an embodiment, the antirolling bracket is made of material having a good thermal conductivity. Generally, metals have good thermal conductivity. In order to enhance the heat dissipation effect, material having a thermal conductivity greater than 45 W/m·K is used to make the antirolling bracket, in an embodiment.

According to an embodiment, metal is a preferable material for the antirolling bracket. Of course, alloy can be used. Generally, metal has a better thermal conductivity than alloy.

According to an embodiment, the roll rage is preferably made as a single unit and the closed passage is formed in the single roll rage.

According to an embodiment, there is at least one closed passage in the antirolling bracket. Of course, there may be a plurality of closed passages in the antirolling bracket in accordance with actual need and specific internal construction of the electronic device.

As shown in FIG. 1, according to an embodiment, the passage in the antirolling bracket has a chamber 20. In the embodiment, the chamber 20 is integrally formed with the antirolling bracket, and the chamber 20 is in a rectangular groove shape, but it can be of any shape.

The first bracket 10 and the chamber 20 define a closed space in which a cooling medium having a thermal conductivity greater than a second threshold is able to circulate.

According to an embodiment, in order to absorb the heat from the first bracket 10 better, the cooling medium also has a good thermal conductivity. In an embodiment, optimally, the cooling medium has a thermal conductivity greater than 0.2 W/m·K. It is better to use material having greater specific heat for the cooling medium in view that the cooling medium needs to have a good heat absorbing performance. However, there is no limit on the specific heat of the cooling medium in an embodiment, as long as the cooling medium has a thermal conductivity greater than 0.2 W/m·K.

Figure 2:
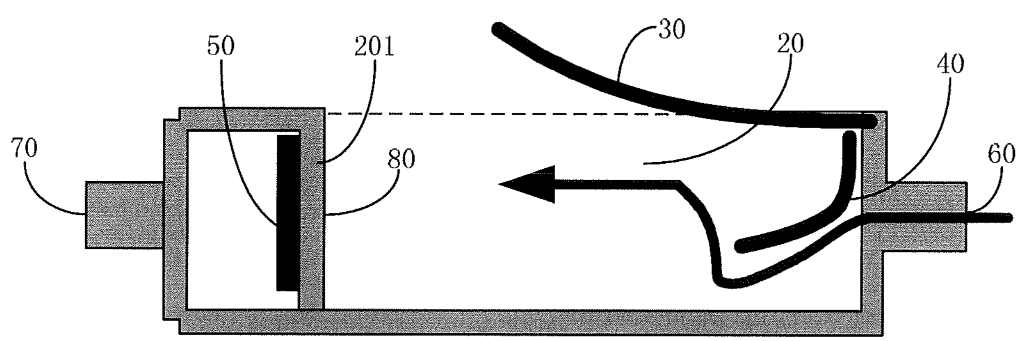
FIG. 2 is a schematic view showing a first operation mode of a driving body in an electronic device according to an embodiment.
Figure 3:
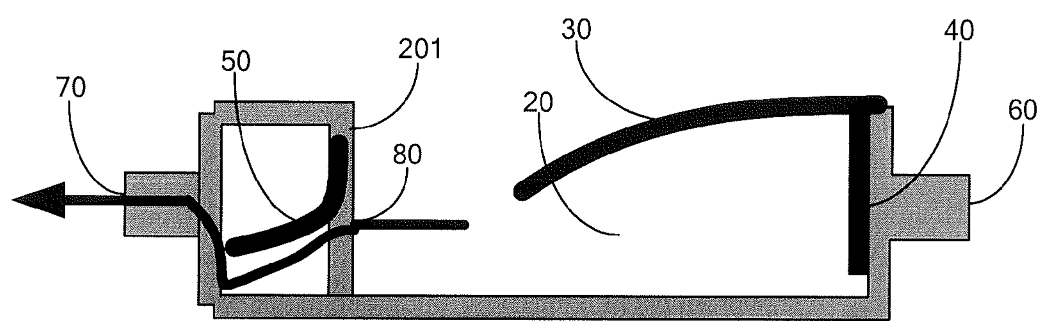
FIG. 3 is a schematic view showing a second operation mode of a driving body in an electronic device according to an embodiment.

FIG. 2 is a schematic view showing a first operation mode for a driving body in an electronic device according to an embodiment, and FIG. 3 is a schematic view showing a second operation mode for a driving body in an electronic device according to an embodiment. Referring to FIGS. 2 and 3, a driving body 30 is provied on at least one side wall of the chamber 20, and, under a perdetermined condition, the driving body 30 is deformable to change a capacity of the chamber in order to drive the cooling medium to flow.

According to an embodiment, the driving body 30 is driven to oscillate such that the cooling medium circulates in the passage formed in the first bracket 10. The cooling medium absorbs heat generated by the first bracket 10 and then carries away the heat. Thus, the heat dissipation is achieved.

According to an embodiment, the cooling medium comprises pure water, ethyl alcohol, or oil. The cooling medium may be a liquid having a thermal conductivity greater than certain threshold.

According to an embodiment, the perdetermined condition may be that the driving body 30 is electrified. Once the driving body 30 is electrified by the power source, the free end of the driving body 30 oscillates.

As an alternative, the first bracket may be a bracket dedicated for heat dissipation provided in the electronic device. For example, the first bracket may be disposed around some components generating heat in the electronic device and the passage is formed within the first bracket, so that the heat dissipation of the components is achieved by circulating the cooling medium within the passage.

Structure of the first bracket is not limited to that disclosed in the embodiment shown in figures. That is, it may be structured in accordance with placement of internal components in the electronic device, as long as a closed passage is defined therein.

FIG. 2 is a schematic view showing a first operation mode for a driving body in an electronic device according to an embodiment, and FIG. 3 is a schematic view showing a second operation mode for a driving body in an electronic device according to an embodiment. Referring to FIGS. 2 and 3, a driving body 30 is disposed to at least one side wall of the chamber 20, the driving body 30 has a first end and a second end opposite to each other, the first end is fixedly connected to the at least one side wall of the chamber while the second end is a free end, and, when the first end is connected to a power source for electronic device and the power source is switched on, the second end oscillates.

In the embodiment, the driving body 30 may have a cuboid shape and the first end thereof is fixedly connected to one side wall of the chamber 20, while the second end thereof is a free end and is able to oscillate. In the embodiment, by means of an up-down oscillation of the second end of the driving body 30, the cooling medium is drawn at one end of the passage of the first bracket 10 but is pushed at the other end of the passage, such that a closed circulating loop of the cooling medium is formed in the passage of the first bracket 10 and the cooling medium circulates therein continuously. As a result, the heat dissipation of heated components in the electronic device will be achieved by means of transferring the heat generated by these components to the first bracket 10 and then carrying away the transferred heat on the first bracket 10 through the circulating cooling medium.

In an embodiment, the driving body 30 may have a quadrant shape, in which the oscillating second end may be the end having greater size. As a result, the up-down oscillation of such second end accelerates circulation of the cooling medium.

In an embodiment, the first end of the driving body 30 is connected to a power source for the electronic device. The driving body 30 is electrified by the power source for the electronic device so as to drive its second end, as the free end, to oscillate. The power supply for the driving body 30 may be obtained by electric circuit on a main board of the electronic device, or through a specific power supply circuit for the driving body 30.

Figure 4:
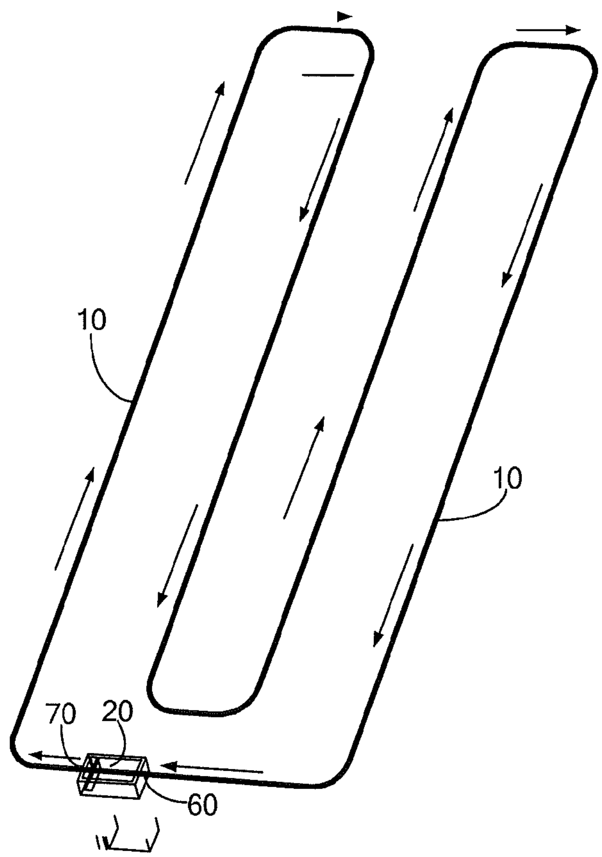
FIG. 4 is a schematic view showing a whole heat dissipation structure in an electronic device according to an embodiment.

FIG. 2 is a schematic view showing a first operation mode for a driving body in an electronic device according to an embodiment, FIG. 3 is a schematic view showing a second operation mode for a driving body in an electronic device according to an embodiment, and FIG. 4 is a schematic side view showing a whole heat dissipation structure in an electronic device according to an embodiment. As shown in FIGS. 2, 3 and 4, according to an embodiment, the chamber 20 is further provided with a partition 201 by which the chamber 20 is divided into a first sub chamber and a second sub chamber, and a first port 60 is provided on an end of the first sub chamber away from the partition while a second port 70 is provided on an end of the second sub chamber away from the partition 201.

The first end of the at least one passage is connected to the first port 60 and the second end thereof is connected to the second port 70 such that at least one loop circuit is formed by the at least one passage and the chamber 20.

A first valve 40 is provided at the first port 60 and a second valve 50 is provided at a third port 80 disposed on the partition 201.

In the embodiment, the first end of the at least one passage in the first bracket 10 is connected to the first port 60 while the second end thereof is connected to the second port 70 such that at least one loop circuit is formed by the at least one passage and the chamber 20.

According to the embodiment, the abovementioned driving body 30 is deformable, under a perdetermined condition, to change a capacity of the chamber in order to drive the cooling medium to flow.

FIG. 2 is a schematic view showing a first operation mode for a driving body in an electronic device according to an embodiment, and FIG. 3 is a schematic view showing a second operation mode for a driving body in an electronic device according to an embodiment.

As shown in FIGS. 2 and 3, with the second end (the free end) of the driving body 30 oscillating, a pressure of the cooling medium within the chamber 20 goes down, and the first valve 40 is opened under the pressure applied by the cooling medium at the first end of the at least one passage in the first bracket 10 such that the cooling medium flows from the first port 60 to the first sub chamber, and, the second valve 50 is closed under the pressure applied by the cooling medium in the second sub chamber.

With the second end (the free end) of the driving body 30 oscillating downwardly, the pressure of the cooling medium within the first sub chamber goes up, and the second valve 50 is opened under the pressure applied by the cooling medium in the first sub chamber such that the cooling medium flows from the third port 80 of the first sub chamber to the second sub chamber and further to the second end of the at least one passage through the second sub chamber, and, the first valve 40 is closed under the pressure applied by the cooling medium in the first sub chamber.

According to an embodiment, with continuous oscillation of the second end of the driving body 30, the cooling medium continuously flows into the first sub chamber via the first port 60, and then, the cooling medium flows to the second sub chamber via the third port 80, next, the cooling medium flows into the passage of the first bracket 10 via the second port 70, such that the cooling medium is circulated within the passage of the first bracket 10.

FIG. 4 shows the circulation of the cooling medium within the passage.

According to an embodiment, the driving body 30 comprises a piezoelectric panel including a substrate that is connected to a positive electrode of the power source for the electronic device and a piezoelectric ceramic that is connected to a negative electrode of the power source for the electronic device.

With the piezoelectric effect of the piezoelectric ceramic, the piezoelectric ceramic deforms under external force and brings the surface thereof to be charged, which is called a direct piezoelectric effect. Conversely, upon applying an electric field, the piezoelectric ceramic deforms mechanically, which is called reversed piezoelectric effect. In the embodiment, the piezoelectric ceramic oscillates when being applied with electric power.

According to an embodiment, the first valve 40 comprises a first flexible waterproof membrane having an upper portion connected to an upper part of the first port 60 and a lower portion as a free portion.

The second valve 50 comprises a second flexible waterproof membrane having an upper portion connected to an upper part of the partition and a lower portion as a free portion.

With the second end of the driving body 30 oscillating upwardly, a slit is formed between the first port and the lower portion of the first flexible waterproof membrane while the lower portion of the second flexible waterproof membrane sticks to the partition such that the cooling medium flows in from the first port.

With the second end of the driving body 30 oscillating downwardly, the lower portion of the first flexible waterproof membrane sticks to the first port while a slit is formed between the partition and the lower portion of the second flexible waterproof membrane such that the cooling medium flows out from the second port.

According to an embodiment, the first chamber is disposed in a first region of the first bracket, and the first region is located at an edge of the first bracket.

According to an embodiment, the first region may be a region where the main board is disposed in the electronic device.

According to an embodiment, a first outer wall of the passage has a thickness less than a first threshold, and the first outer wall is located at a surface of the first bracket.

According to an embodiment, the first bracket 10 has a wall of small thickness at positions where the passage is formed. In this way, the heat of the electronic components to be cooled can be easily absorbed and taken away by the cooling medium. A thinner thickness is preferable, as long as the first bracket 10 is firm enough. As an example, the first bracket 10 may have a wall thickness less than 0.5 mm at positions where the passage is formed.

The technical features and solutions recited in these embodiments may be combined in any way, as long as there is no harm in the combination.

It should be understood that the electronic device disclosed according to these embodiments is only for exemplary purposes and may be implemented in other ways. The components described separately in the embodiments may be or may not be physically separated from each other.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An electronic device, comprising a first bracket that is made of a first material having a thermal conductivity greater than a first threshold and has therein at least one passage is connected to a chamber;

wherein the first bracket and the chamber define a closed space in which a cooling medium having a thermal conductivity greater than a second threshold is able to circulate; and wherein the chamber is provided with a driving body at at least one side wall of the chamber and the driving body is deformable under a perdetermined condition to change a capacity of the chamber so as to drive the cooling medium to flow.

2. The electronic device according to claim 1, wherein, the driving body has a first end and a second end opposite to each other, the first end is fixedly connected to the at least one side wall of the chamber while the second end is a free end, and wherein, the first end is connected to a power source for the electronic device and when the power source is switched on, the second end oscillates.

3. The electronic device according to claim 2, wherein, the chamber is further provided with a partition dividing the chamber into a first sub chamber and a second sub chamber, and a first port is provided on an end of the first sub chamber away from the partition while a second port is provided on an end of the second sub chamber away from the partition;

a first end of the at least one passage is connected to the first port and a second end of the at least one passage is connected to the second port such that the at least one passage and the chamber form a loop circuit; and a first valve is provided at the first port and a second valve is provided at a third port provided on the partition.

4. The electronic device according to claim 3, wherein, with the second end of the driving body oscillating upwardly, a pressure of the cooling medium within the first sub chamber goes down, and the first valve is opened under the pressure applied by the cooling medium at the first end of the at least one passage such that the cooling medium flows from the first port to the first sub chamber, and, the second valve is closed under the pressure applied by the cooling medium within the second sub chamber; and with the second end of the driving body oscillating downwardly, the pressure of the cooling medium within the first sub chamber goes up, and the second valve is opened under the pressure applied by the cooling medium within the first sub chamber such that the cooling medium flows from the third port of the first sub chamber to the second sub chamber and further to the second end of the at least one passage through the second sub chamber, and, the first valve is closed under the pressure applied by the cooling medium within the first sub chamber.

5. The electronic device according to claim 3, wherein, the driving body comprises a piezoelectric panel including a substrate that is connected to a positive electrode of the power source for the electronic device and a piezoelectric ceramic that is connected to a negative electrode of the power source for the electronic device.

6. The electronic device according to claim 3, wherein, the first valve comprises a first flexible waterproof membrane having an upper portion connected to an upper part of the first port and a lower portion as a free portion; and the second valve comprises a second flexible waterproof membrane having an upper portion connected to an upper part of the partition and a lower portion as a free portion;

with the second end of the driving body oscillating upwardly, a slit is formed between the first port and the lower portion of the first flexible waterproof membrane while the lower portion of the second flexible waterproof membrane sticks to the partition such that the cooling medium flows in from the first port; and with the second end of the driving body oscillating downwardly, the lower portion of the first flexible waterproof membrane sticks to the first port while a slit is formed between the partition and the lower portion of the second flexible waterproof membrane such that the cooling medium flows out from the second port.

7. The electronic device according to claim 3, wherein, the first chamber is disposed in a first region of the first bracket, which is located at an edge of the first bracket.

8. The electronic device according to claim 3, wherein, a first outer wall of the passage has a thickness less than a first threshold and is located at a surface of the first bracket.

9. The electronic device according to claim 3, wherein, the first material comprises metal, and, the cooling medium comprises pure water, ethyl alcohol, or oil.

10. The electronic device according to claim 9, wherein, the first threshold is greater than the second threshold.

* * * * *